United States Patent
Chang et al.

(10) Patent No.: US 11,545,908 B2
(45) Date of Patent: Jan. 3, 2023

(54) FLYBACK POWER CONVERTER AND CONVERSION CONTROLLER CIRCUIT

(71) Applicant: Richtek Technology Corporation, Zhubei (TW)

(72) Inventors: Wei-Hsu Chang, Hsinchu (TW); Kun-Yu Lin, Hsinchu (TW); Tzu-Chen Lin, Changhua (TW); Ta-Yung Yang, Taoyuan (TW)

(73) Assignee: RICHTEK TECHNOLOGY CORPORATION, Zhubei (TW)

( * ) Notice: Subject to any disclaimer, the term of this patent is extended or adjusted under 35 U.S.C. 154(b) by 35 days.

(21) Appl. No.: 17/245,043

(22) Filed: Apr. 30, 2021

(65) Prior Publication Data
US 2021/0384838 A1 Dec. 9, 2021

(30) Foreign Application Priority Data
Jun. 4, 2020 (TW) .................. 109118823

(51) Int. Cl.
*H02M 3/335* (2006.01)
*H02M 1/00* (2006.01)
*H04B 10/80* (2013.01)
*H03K 17/78* (2006.01)

(52) U.S. Cl.
CPC ..... *H02M 3/33576* (2013.01); *H02M 1/0025* (2021.05); *H02M 1/0032* (2021.05); *H03K 17/78* (2013.01); *H04B 10/802* (2013.01)

(58) Field of Classification Search
None
See application file for complete search history.

(56) References Cited

U.S. PATENT DOCUMENTS

| 5,689,407 A * | 11/1997 | Marinus | H02M 3/33523 363/49 |
| 7,218,060 B1 * | 5/2007 | Lin | H05B 41/295 315/219 |
| 8,416,553 B2 * | 4/2013 | Zhan | H02M 3/33507 361/220 |
| 8,416,584 B2 | 4/2013 | Zhan et al. | |
| 8,767,419 B2 | 7/2014 | Huang | |
| 9,853,554 B2 * | 12/2017 | Chang | H02M 3/33523 |
| 2014/0140107 A1 * | 5/2014 | Chen | H02M 3/33523 363/21.15 |
| 2016/0308452 A1 * | 10/2016 | Motoki | H02M 3/33523 |

* cited by examiner

*Primary Examiner* — Jeffrey A Gblende
(74) *Attorney, Agent, or Firm* — Tung & Associates

(57) ABSTRACT

A flyback power converter circuit includes a transformer, a blocking switch, a primary side switch, a primary side controller circuit and a secondary side controller circuit. The transformer is coupled between an input voltage and an internal output voltage in an isolated manner. The blocking switch controls the electric connection between the internal output voltage and an external output voltage. In a standby mode, the internal output voltage is regulated to a standby voltage, and the blocking switch is controlled to be OFF; in an operation mode, the internal output voltage is regulated to an operating voltage, and the blocking switch is controlled to be ON, such that the external output voltage has the operating voltage. The standby voltage is smaller than the operating voltage, so that the power consumption of the flyback power converter circuit is reduced in the standby mode.

10 Claims, 7 Drawing Sheets

FLYBACK POWER CONVERTER AND CONVERSION CONTROLLER CIRCUIT

CROSS REFERENCE

The present invention claims priority to TW 109118823 filed on Jun. 4, 2020.

BACKGROUND OF THE INVENTION

Field of Invention

The present invention relates to a flyback power converter circuit; particularly, it relates to such flyback power converter circuit capable of reducing power consumption in a standby mode. The present invention also relates to a conversion controller circuit for controlling the above-mentioned flyback power converter circuit.

Description of Related Art

The following prior art is relevant to the present invention: U.S. Pat. No. 8,767,419B2 "Feedback Circuit with Feedback Impedance Modulation for Improving Power Saving".

Please refer to FIG. 1, which shows a schematic diagram of a conventional flyback power converter circuit (i.e., flyback power converter circuit 1000). The flyback power converter circuit comprises: a transformer 50', a blocking switch Mb', a primary side switch S1', a primary side controller circuit 100', a secondary side controller circuit 200' and a photocoupler 41'. The transformer 50' is coupled between an input voltage Vin' and an internal output voltage Voi' in an isolated manner. The blocking switch Mb' is configured to control the electric connection between the internal output voltage Voi' and an external output voltage Vo'. The secondary side controller circuit 200' feedbacks information related to the internal output voltage Voi' to the primary side controller circuit 100' via the photocoupler 41'. The primary side controller circuit 100' controls the switching of the primary side switch S1', so as to regulate the internal output voltage Voi'.

Although the prior art of FIG. 1 can control the electric connection between the internal output voltage Voi' and the external output voltage Vo' via the blocking switch Mb', such that the internal output voltage Voi' is electrically connected to the external output voltage Vo' after the internal output voltage Voi' has been regulated to the required voltage, but the prior art of FIG. 1 still consumes a significant amount of power in the standby mode.

As compared to the prior art in FIG. 1, the present invention is advantageous in that: the present invention can significantly reduce the power consumption in the standby mode, by either controlling the standby voltage of the internal output voltage to be smaller than the operating voltage, or, by controlling the bias current of the photocoupler such that its current level in the standby mode is smaller than the current level in the operation mode.

SUMMARY OF THE INVENTION

From one perspective, the present invention provides a flyback power converter circuit, comprising: a transformer, which is coupled between an input voltage and an internal output voltage; a blocking switch, which is configured to operably control an electric connection between the internal output voltage and an external output voltage; a primary side switch, which is configured to operably control a primary side winding of the transformer, so as to convert the input voltage to the internal output voltage at a secondary side of the transformer; a primary side controller circuit, which is configured to operably control the primary side switch; and a secondary side controller circuit, which is configured to operably control the blocking switch; wherein in a standby mode, the internal output voltage is regulated to a standby voltage and the blocking switch is controlled to be OFF; and wherein in an operation mode, the internal output voltage is regulated to an operating voltage and the blocking switch is controlled to be ON, such that the external output voltage has the operating voltage; wherein the standby voltage is smaller than the operating voltage to reduce the power consumption of the flyback power converter circuit in the standby mode.

In one embodiment, the secondary side controller circuit includes a detection controller circuit, which is configured to operably determine whether the flyback power converter circuit is coupled to a load and to operably control the blocking switch; wherein when it is determined that the flyback power converter circuit is coupled to the load, the blocking switch is controlled to be ON, and wherein when it is determined that the flyback power converter circuit is not coupled to the load, the blocking switch is controlled to be OFF.

In one embodiment, the flyback power converter circuit further comprises: an isolated type feedback device, which is configured to operably couple a secondary side feedback signal generated from the secondary side controller circuit to generate a primary side feedback signal in an isolated manner, and to input the primary side feedback signal to the primary side controller circuit, for regulating the internal output voltage; wherein the secondary side feedback signal is related to the internal output voltage; wherein the secondary side controller circuit further includes a first error amplifier, which is configured to operably amplify a difference between the internal output voltage and a first reference voltage, so as to generate the secondary side feedback signal; wherein in the standby mode, the secondary side controller circuit adjusts the first reference voltage, so as to set the standby voltage, and wherein in the operation mode, the secondary side controller circuit adjusts the first reference voltage, so as to set the operating voltage.

In one embodiment, the isolated type feedback device is configured as a photocoupler or a pulse transformer.

In one embodiment, the transformer further includes an auxiliary winding, which is configured to operably generate an auxiliary voltage, wherein a proportional relationship exists between the auxiliary voltage and the internal output voltage; wherein the primary side controller circuit includes a second error amplifier, which is configured to operably amplify a difference between an adjustment voltage and a second reference voltage, so as to generate an error amplification signal; wherein the adjustment voltage is a divided voltage of the auxiliary voltage; wherein in the standby mode, the primary side controller circuit adjusts the second reference voltage, so as to set the standby voltage, and wherein in the operation mode, the primary side controller circuit adjusts the second reference voltage, so as to set the operating voltage.

From another perspective, the present invention provides a flyback power converter circuit, comprising:
a transformer, which is coupled between an input voltage and an internal output voltage;
a primary side switch, which is configured to operably control a primary side winding of the transformer, so as to convert the input voltage to the internal output voltage at a secondary side of the transformer; a primary side controller circuit, which is configured to operably control an adjustment resistor and the primary side switch; a secondary side controller circuit; a photocoupler, which is configured to operably couple a secondary side feedback signal generated from the secondary side controller circuit to generate a primary side feedback signal by means of photo coupling, and to input the primary side feedback signal to the primary side controller circuit, for regulating the internal output voltage; wherein the secondary side feedback signal is related to the internal output voltage; wherein the adjustment resistor is configured to operably provide a bias current to the photocoupler, so as to generate the primary side feedback signal; wherein in a standby mode, the adjustment resistor is controlled by the primary side controller circuit, so that the adjustment resistor has a standby resistance; and wherein in an operation mode, the adjustment resistor is controlled by the primary side controller circuit, so that the adjustment resistor has an operating resistance; wherein the standby resistance is greater than the operating resistance, so that the power consumption of the flyback power converter circuit is reduced in the standby mode.

From yet another perspective, the present invention provides a conversion controller circuit, which is configured to operably control a flyback power converter circuit, wherein the flyback power converter circuit includes: a transformer, which is coupled between an input voltage and an internal output voltage; and a primary side switch, which is configured to operably control a primary side winding of the transformer, so as to convert the input voltage to the internal output voltage at a secondary side of the transformer; the conversion controller circuit comprising: a primary side controller circuit, which is configured to operably control an adjustment resistor and the primary side switch; a secondary side controller circuit, which is configured to operably couple a secondary side feedback signal to generate a primary side feedback signal by means of photo coupling via a photocoupler, and to transmit the primary side feedback signal to the primary side controller circuit, for regulating the internal output voltage; wherein the secondary side feedback signal is related to the internal output voltage; wherein the adjustment resistor is configured to operably provide a bias current to the photocoupler, so as to generate the primary side feedback signal; wherein in a standby mode, the adjustment resistor is controlled by the primary side controller circuit, so that the adjustment resistor has a standby resistance; and wherein in an operation mode, the adjustment resistor is controlled by the primary side controller circuit, so that the adjustment resistor has an operating resistance; wherein the standby resistance is greater than the operating resistance, so that the power consumption of the flyback power converter circuit is reduced in the standby mode.

The objectives, technical details, features, and effects of the present invention will be better understood with regard to the detailed description of the embodiments below, with reference to the attached drawings.

DESCRIPTION OF THE PREFERRED EMBODIMENTS

The drawings as referred to throughout the description of the present invention are for illustration only, to show the interrelations between the circuits and the signal waveforms, but not drawn according to actual scale of circuit sizes and signal amplitudes and frequencies.

Figure 1:
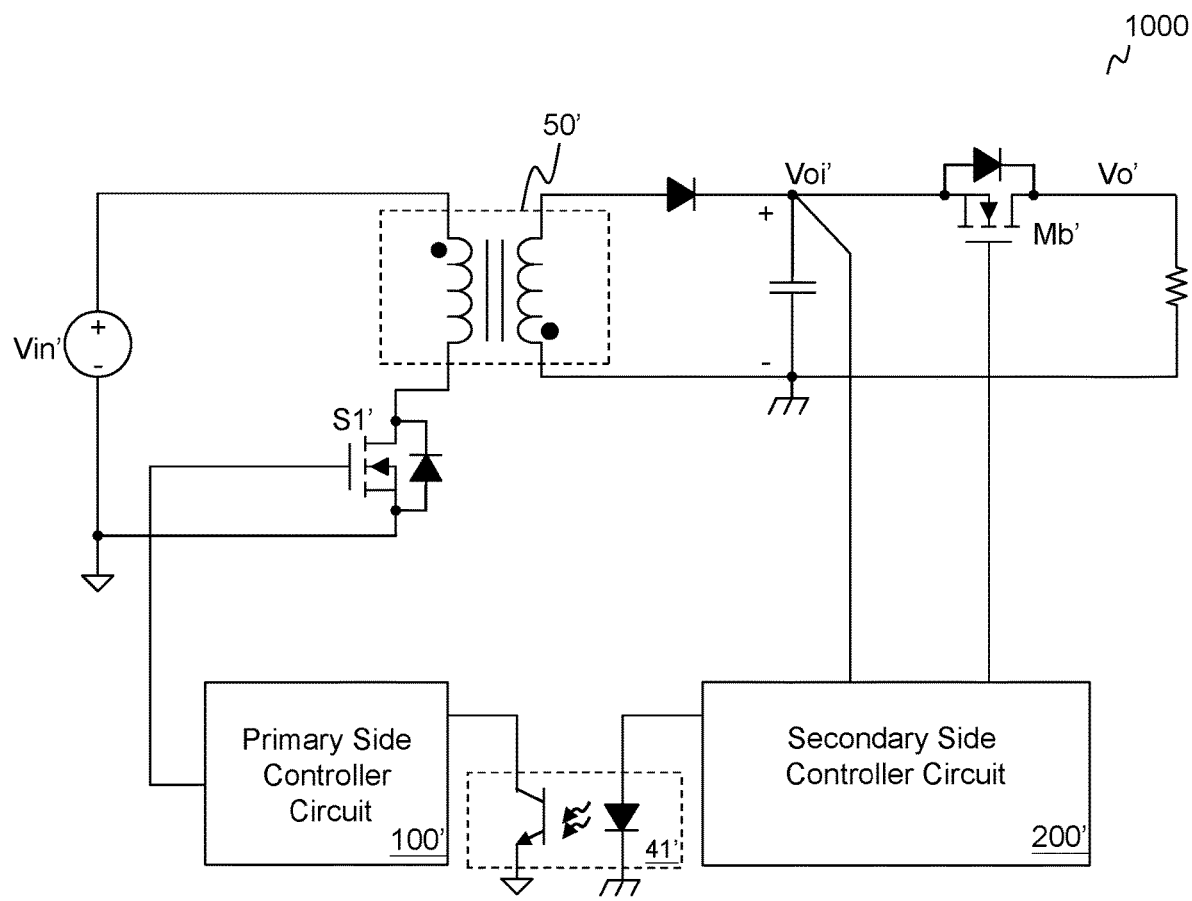
FIG. 1 shows a schematic diagram of a conventional flyback power converter circuit.
Figure 2:
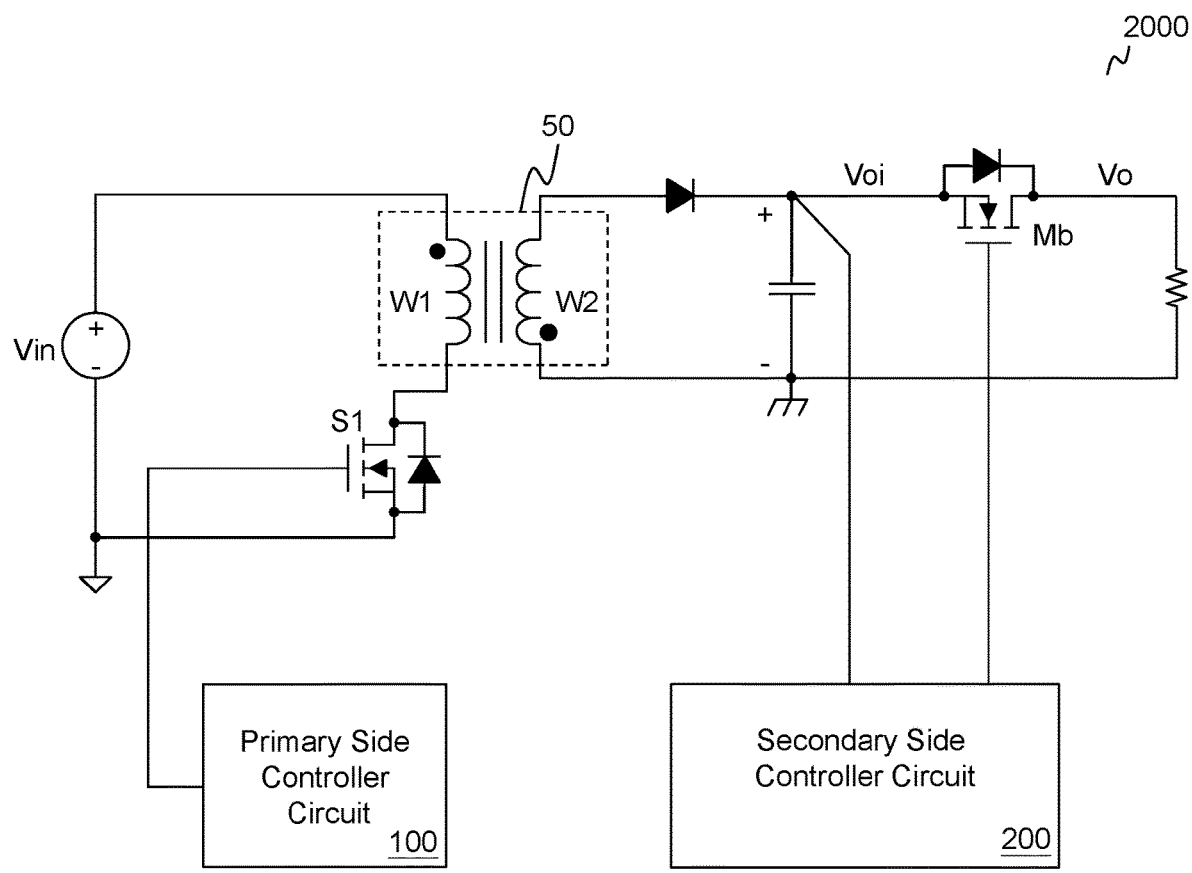
FIG. 2 shows a schematic block diagram of a flyback power converter circuit according to an embodiment of the present invention.

Please refer to FIG. 2, which shows a schematic block diagram of a flyback power converter circuit (i.e., flyback power converter circuit 2000) according to an embodiment of the present invention. In one embodiment, the flyback power converter circuit 2000 comprises: a transformer 50, a blocking switch Mb, a primary side switch S1, a primary side controller circuit 100 and a secondary side controller circuit 200.

In one embodiment, the transformer 50 is coupled between an input voltage Vin and an internal output voltage Voi in an isolated manner. The transformer 50 includes a primary side winding W1 and a secondary side winding W2. The blocking switch Mb is configured to operably control the electric connection between the internal output voltage Voi and an external output voltage Vo. The primary side controller circuit 100 is configured to operate the primary side switch S1 to control a primary side winding W1 of the transformer 50, so as to convert the input voltage Vin to the internal output voltage Voi at a secondary side W2 of the transformer 50. The secondary side controller circuit controls the blocking switch Mb. In one embodiment, in a standby mode, the internal output voltage Voi is regulated to a standby voltage and the blocking switch Mb is controlled to be OFF; in an operation mode, the internal output voltage Voi is regulated to an operating voltage and the blocking switch Mb is controlled to be ON, such that the external output voltage Vo has the operating voltage. The above-mentioned standby voltage is smaller than the above-mentioned operating voltage, to reduce the power consumption of the flyback power converter circuit 2000 in the standby mode.

Figure 3:
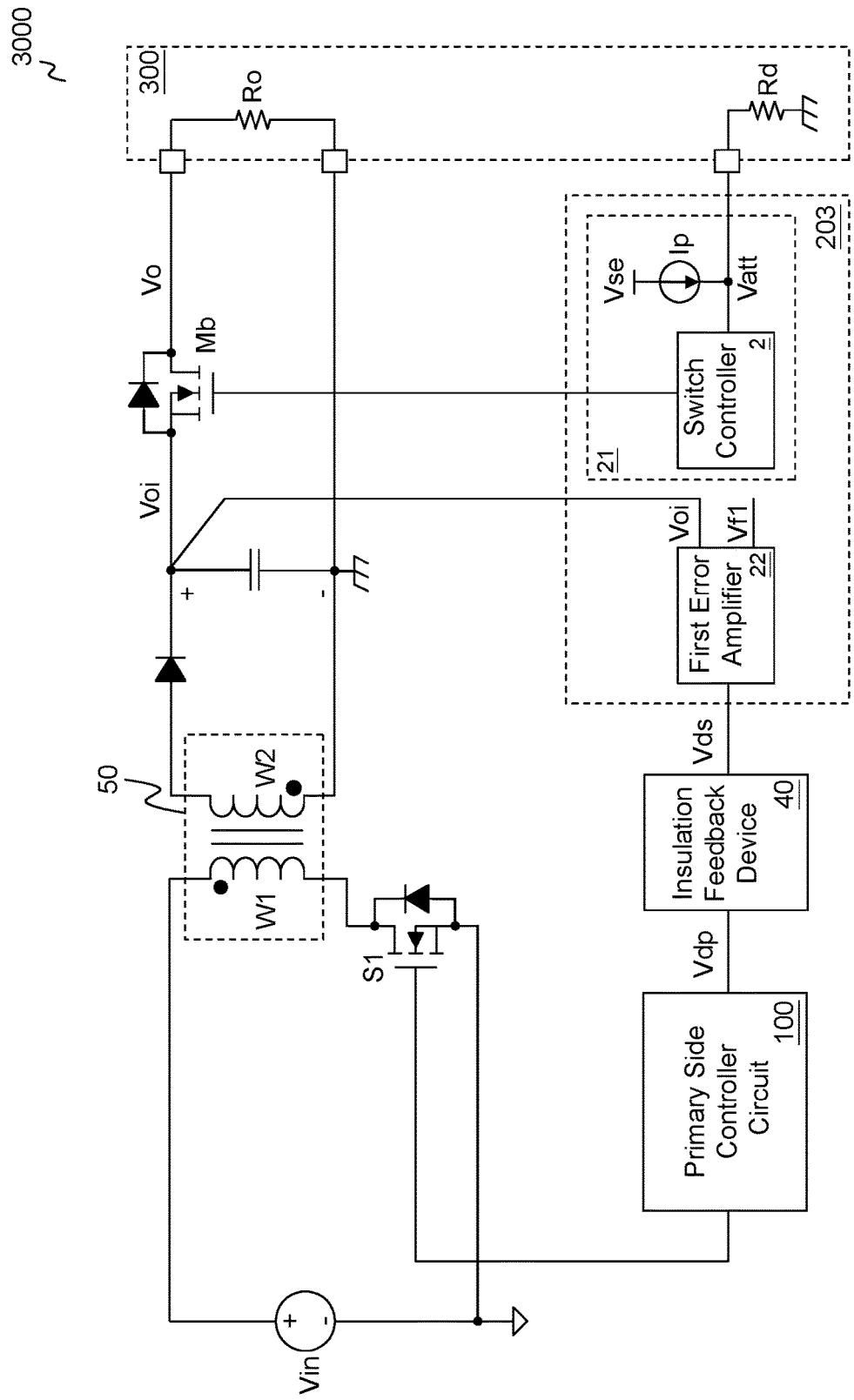
FIG. 3 shows a schematic diagram of a flyback power converter circuit according to an embodiment of the present invention.

Please refer to FIG. 3, which shows a schematic diagram of a flyback power converter circuit (i.e., flyback power converter circuit 3000) according to an embodiment of the present invention. In this embodiment, the flyback power converter circuit 3000 comprises: a transformer 50, a blocking switch Mb, a primary side switch S1, a primary side controller circuit 100, a secondary side controller circuit 203 and an isolated type feedback device 40. A load 300 can be coupled to the flyback power converter circuit 3000 by removable connection (e.g., by a connector and/or a connection cable). The load 300 can be removed and not coupled to the flyback power converter circuit 3000.

In one embodiment, the load 300 includes an output resistor Ro and a pull-down resistor Rd. In one embodiment, the secondary side controller circuit 203 includes a detection controller circuit 21 and a first error amplifier 22. The detection controller circuit 21 is configured to operably determine whether the flyback power converter circuit 3000 is coupled to the load 300. The detection controller circuit 21 includes a switch controller 2, a power source Vse and a current source Ip. In one embodiment, the current source Ip is coupled between the power source Vse and a detection voltage Vatt. The switch controller 2 is configured to operably determine whether the flyback power converter circuit 3000 is coupled to the load 300 according to the detection voltage Vatt. In one embodiment, the switch controller 2 is configured to operably control the blocking switch Mb according to the above-mentioned determination result. If necessary, the blocking switch Mb can be controlled further according to other factors. In one embodiment, when it is determined that the flyback power converter circuit 3000 is coupled to the load 300, the blocking switch Mb is controlled to be ON. When it is determined that the flyback power converter circuit 3000 is not coupled to the load 300, the blocking switch Mb is controlled to be OFF.

More specifically, as shown in FIG. 3, under a situation where the flyback power converter circuit 3000 is coupled to the load 300, because the current source Ip is coupled to the pull-down resistor Rd (note that the pull-down resistor Rd has a finite resistance), the detection voltage Vatt has a finite voltage level which falls within a predetermined voltage range. Under such situation, the detection controller circuit 21 can determine that the flyback power converter circuit 3000 is coupled to the load 300 and the switch controller 2 can control the blocking switch Mb to be ON. Under a situation where the flyback power converter circuit 3000 is not coupled to the load 300, the detection voltage Vatt will be pulled-up by the current source Ip to the power source Vse. That is, the detection voltage Vatt will be pulled-up to a high voltage level which is beyond the above-mentioned predetermined voltage range. Under such situation, the detection controller circuit 21 can determine that the flyback power converter circuit 3000 is not coupled to the load 300 and the switch controller 2 can control the blocking switch Mb to be OFF.

Please still refer to FIG. 3. As shown in FIG. 3, in one embodiment, the first error amplifier 22 is configured to operably amplify a difference between the internal output voltage Voi and a first reference voltage Vf1, so as to generate a secondary side feedback signal Vds. The internal output voltage Voi is determined according to the first reference voltage Vf1. In one embodiment, the internal output voltage Voi can be regulated to be, for example, equal to the first reference voltage Vf1. The isolated type feedback device 40 is configured to operably couple the secondary side feedback signal Vds generated from the secondary side controller circuit 203 to the primary side controller circuit 100 in an isolated manner; the isolated type feedback device 40 generates a primary side feedback signal Vdp according to the secondary side feedback signal Vds and inputs the primary side feedback signal Vdp to the primary side controller circuit 100, so as to control the switching of the primary side switch S1 to thereby regulate the internal output voltage Voi. The secondary side feedback signal Vds is related to the internal output voltage Voi. In one embodiment, the flyback power converter circuit 3000 has an operation mode and a standby mode. In the standby mode, the secondary side controller circuit 203 adjusts the first reference voltage Vf1 to determine a standby voltage, and the internal output voltage Voi is regulated to the standby voltage. In the operation mode, the secondary side controller circuit 203 adjusts the first reference voltage Vf1 to determine an operating voltage, and the internal output voltage Voi is regulated to the operating voltage. In summary, when the detection controller circuit 21 determines that the flyback power converter circuit 3000 is not coupled to the load 300 (i.e., when the detection controller circuit 21 determines that the load 300 is remove from the flyback power converter circuit 3000), the flyback power converter circuit 3000 will operate in the standby mode. Under such situation, the switch controller 2 will control the blocking switch Mb to be OFF and the internal output voltage Voi will be regulated to the standby voltage. On the other hand, when the detection controller circuit 21 determines that the flyback power converter circuit 3000 is coupled to the load 300 (i.e., when the detection controller circuit 21 determines that the load 300 is connected to the flyback power converter circuit 3000), the flyback power converter circuit 3000 will operate in the operation mode. Under such situation, the switch controller 2 will control the blocking switch Mb to be ON and the internal output voltage Voi will be regulated to the operating voltage. In one embodiment, under such situation, the external output voltage Vo is the operating voltage. The above-mentioned standby voltage is smaller than the above-mentioned operating voltage, to reduce the power consumption of the flyback power converter circuit 3000 in the standby mode.

Figure 4A:
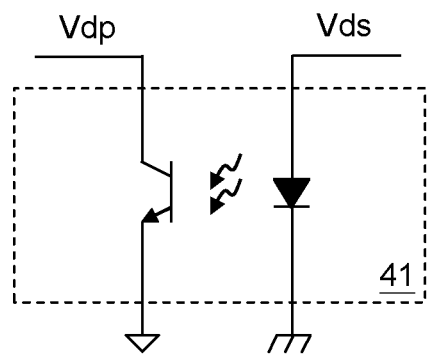
FIG. 4A and FIG. 4B show two embodiments of isolated type feedback devices, respectively.
Figure 4B:
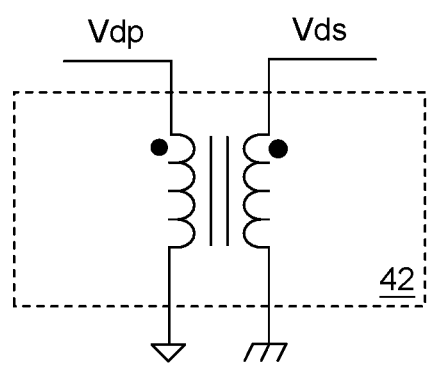

Please refer to FIG. 4A and FIG. 4B. FIG. 4A and FIG. 4B show two embodiments of the isolated type feedback devices, respectively. As shown by the embodiments, the above-mentioned isolated type feedback device can be implemented as a photocoupler 41 (as shown in FIG. 4A) or a pulse transformer 42 (as shown in FIG. 4B).

Figure 5:
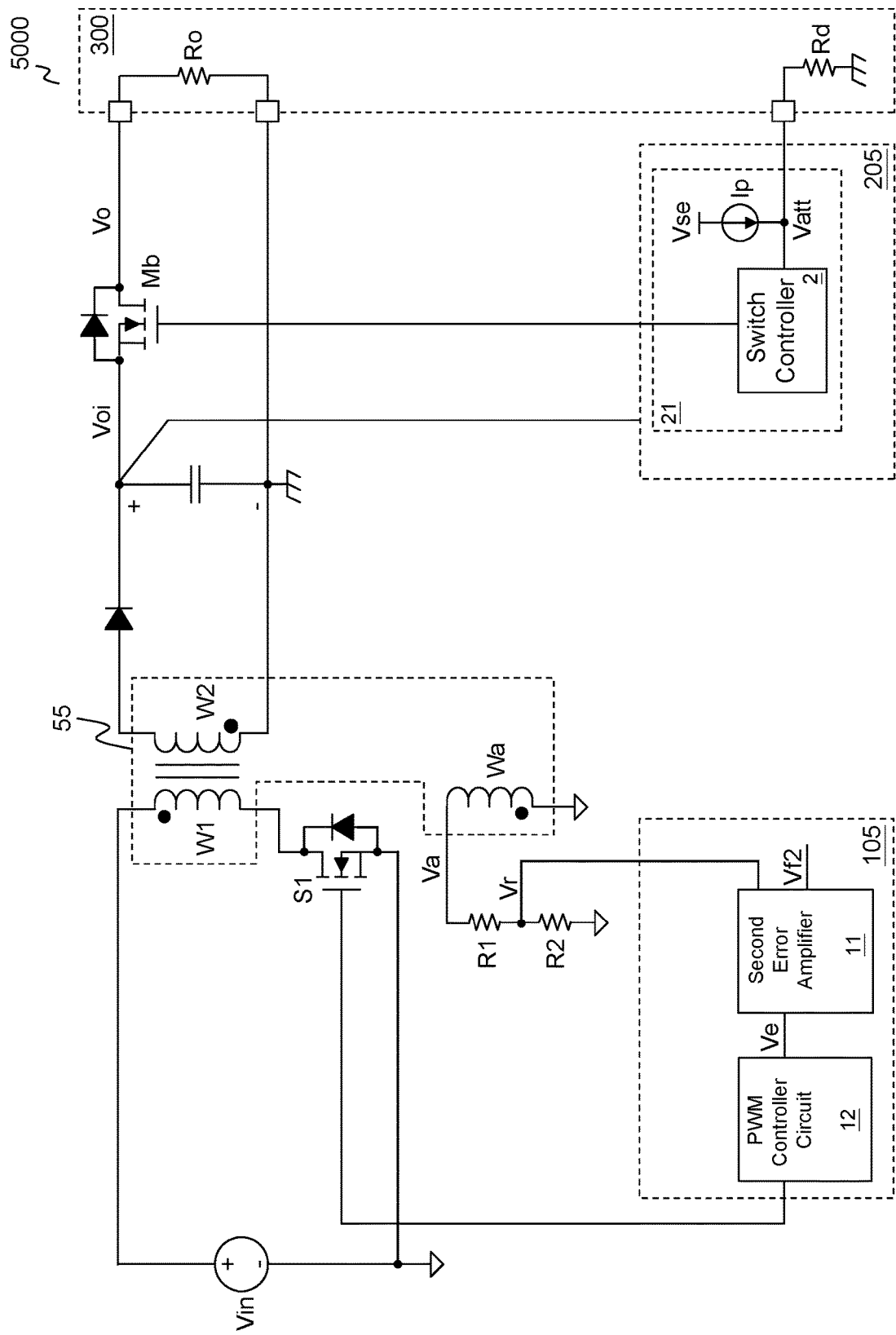
FIG. 5 shows a schematic diagram of a flyback power converter circuit according to another embodiment of the present invention.

Please refer to FIG. 5, which shows a schematic diagram of a flyback power converter circuit (i.e., flyback power converter circuit 5000) according to another embodiment of the present invention. In this embodiment, the flyback power converter circuit 5000 comprises: a transformer 55, a blocking switch Mb, a primary side switch S1, a primary side controller circuit 105, a secondary side controller circuit 205 and a load 300. The transformer 55 of this embodiment is similar to the transformer 50 of the previous embodiments, but is different in that in this embodiment, the transformer 55 further includes an auxiliary winding Wa, which is configured to operably generate an auxiliary voltage Va. A proportional relationship (which is related to the turn ratio of the auxiliary winding Wa to the secondary side winding W2) exists between the auxiliary voltage Va and the internal output voltage Voi. In one embodiment, an adjustment voltage Vr is generated as a divided voltage (between a voltage divider resistor R1 and a voltage divider resistor R2) of the auxiliary voltage Va. In one embodiment, the primary side controller circuit 105 includes a second error amplifier 11 and a pulse width modulation (PWM) controller circuit 12. The second error amplifier 11 is configured to operably amplify a difference between the adjustment voltage Vr and a second reference voltage Vf2, so as to generate an error amplification signal Ve. The PWM controller circuit 12 is configured to operably control the switching of the primary side switch S1 according to the error amplification signal Ve. In one embodiment, in the standby mode, the primary side controller circuit 105 adjusts the second reference voltage Vf2 to set the standby voltage, so that the internal output voltage Voi is regulated to the standby voltage. In the operation mode, the primary side controller circuit 105 adjusts the second reference voltage Vf2 to set the operating voltage, so that the internal output voltage Voi is regulated to the operating voltage. The above-mentioned standby voltage is smaller than the above-mentioned operating voltage to reduce the power consumption of the flyback power converter circuit 5000 in the standby mode.

Figure 6:
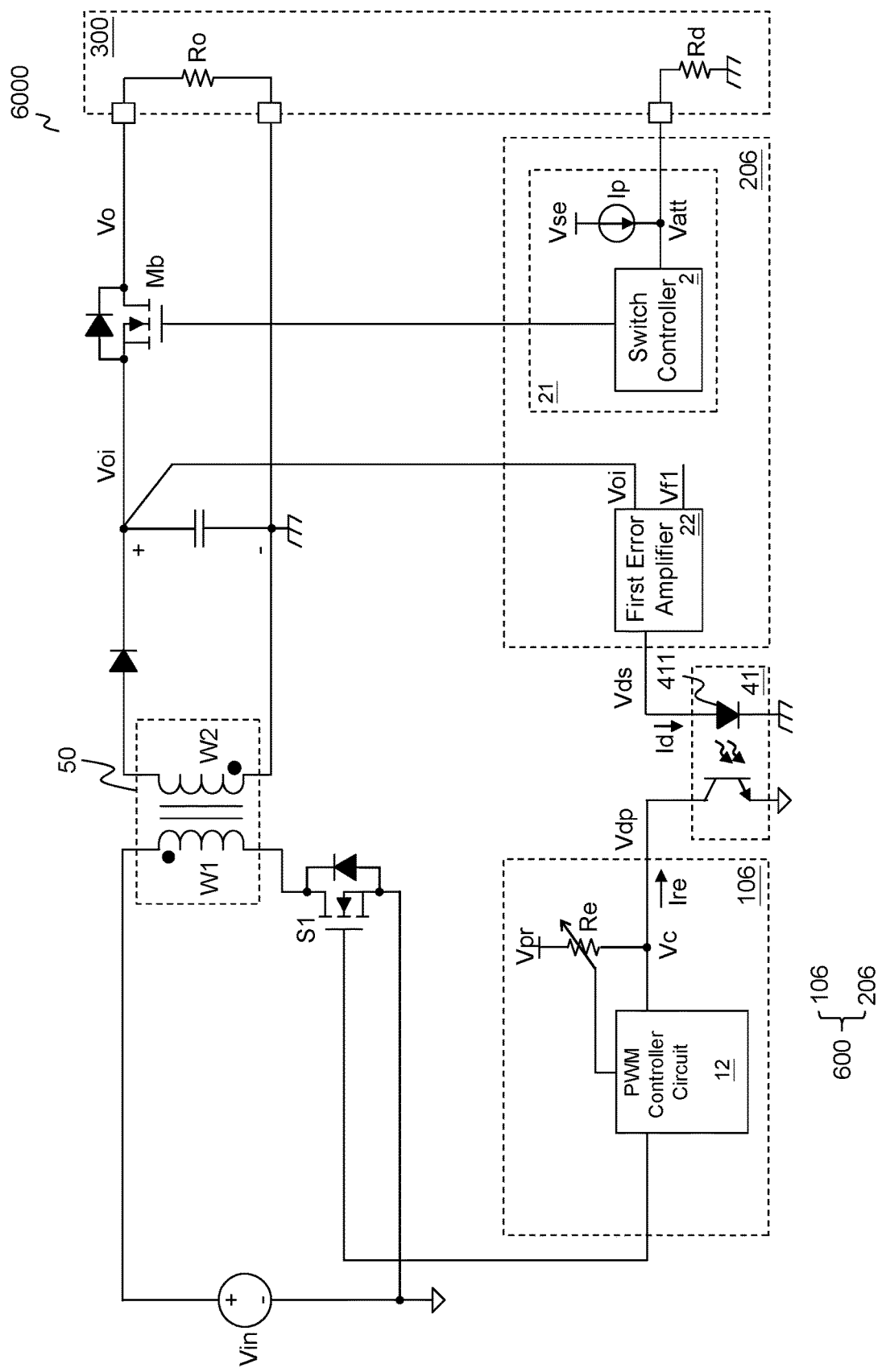
FIG. 6 shows a schematic diagram of a flyback power converter circuit according to yet another embodiment of the present invention.

Please refer to FIG. 6, which shows a schematic diagram of a flyback power converter circuit (i.e., flyback power converter circuit 6000) according to yet another embodiment of the present invention. In this embodiment, the flyback power converter circuit 6000 comprises: a transformer 50, a blocking switch Mb, a primary side switch S1, a primary side controller circuit 106, a secondary side controller circuit 206 and a photocoupler 41. The transformer 50, the blocking switch Mb and the primary side switch S1 of this embodiment operate in the same way as the transformer 50, the blocking switch Mb and the primary side switch S1 in the previous embodiment of FIG. 2, so the details thereof are not redundantly repeated here. The secondary side controller circuit 206 of this embodiment operates in the same way as secondary side controller circuit 203 in the previous embodiment of FIG. 3, so the details thereof are not redundantly repeated here. In one embodiment, the primary side controller circuit 106 and the secondary side controller circuit 206 form a conversion controller circuit 600.

In one embodiment, the primary side controller circuit 106 includes: a PWM controller circuit 12, a power source Vpr and an adjustment resistor Re. The PWM controller circuit 12 is configured to operably control the adjustment resistor Re and the primary side switch S1. In one embodiment, the adjustment resistor Re is coupled between the power source Vpr and a control voltage Vc. The adjustment resistor Re is configured to operably provide a bias current Ire to a photo-coupling transistor of the photocoupler 41, so as to generate a primary side feedback signal Vdp. Under a situation where the control voltage Vc is at a given level, the bias current Ire is negatively correlated to the adjustment resistor Re (e.g., Ire=(Vpr−Vc)/Re). In one embodiment, the photocoupler 41 is configured to operably couple a secondary side feedback signal Vds generated from the secondary side controller 206 circuit to generate a primary side feedback signal Vdp by means of photo coupling, and input the thus generated primary side feedback signal Vdp to the primary side controller circuit 106, for regulating the internal output voltage Voi. The secondary side feedback signal Vds is related to the internal output voltage Voi. In one embodiment, the secondary side generates a bias current Id through the photocoupler 41. The bias current Ire has a level which is equal to a product of the bias current Id multiplied by a current transfer ratio (CTR) (i.e., Ire=CTR*Id). The bias current Id at the secondary side is configured to operably drive a light emitting diode 411 of the photocoupler 41.

In this embodiment, the power consumption of the flyback power converter circuit 6000 can be effectively reduced through controlling the resistance of the adjustment resistor Re by the PWM controller circuit 12. More specifically, in the standby mode, the adjustment resistor Re is controlled by the PWM controller circuit 12, so that the adjustment resistor Re has a standby resistance. In the operation mode, the adjustment resistor Re is controlled by the PWM controller circuit 12, so that the adjustment resistor Re has an operating resistance. The standby resistance is greater than the operating resistance. As mentioned above, the bias current Ire is negatively correlated to the adjustment resistor Re; therefore when the adjustment resistor Re has a relatively greater standby resistance in the standby mode, the bias current Ire has a relatively smaller current level and the bias current Id has a relatively smaller current level. On the contrary, when the adjustment resistor Re has a relatively smaller operating resistance in the operation mode, the bias current Ire has a relatively greater current level and the bias current Id has a relatively greater current level. By the above-mentioned operations, in the standby mode, because the adjustment resistor Re is relatively greater while the bias current Ire and the bias current Id are relatively smaller, the power consumption of the flyback power converter circuit 6000 can be effectively reduced. And, in the operation mode, the bias current Ire and the bias current Id still have sufficient current levels required for operation.

Figure 7:
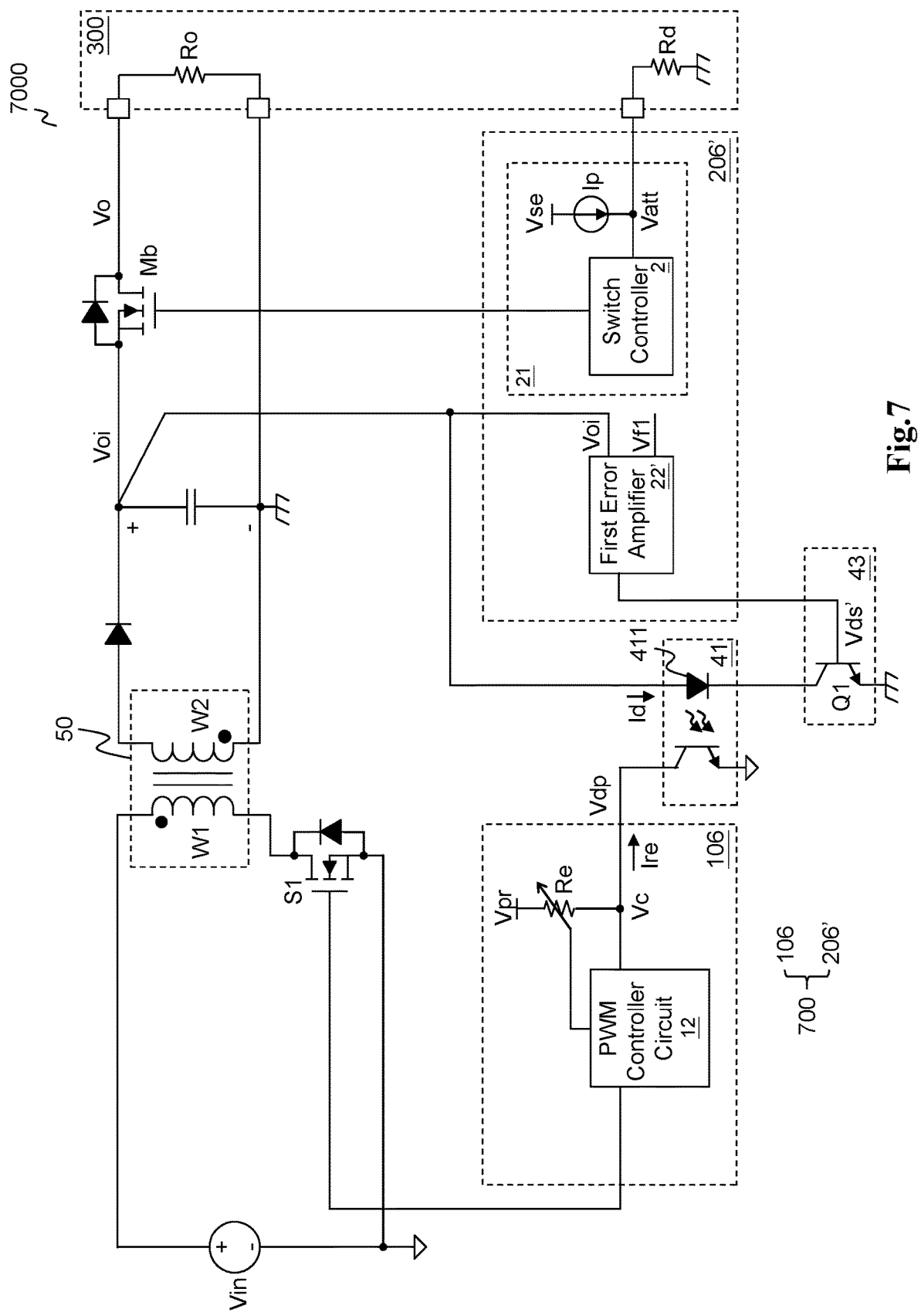
FIG. 7 shows a schematic diagram of a flyback power converter circuit according to still another embodiment of the present invention.

Please refer to FIG. 7, which shows a schematic diagram of a flyback power converter circuit (i.e., flyback power converter circuit 7000) according to still another embodiment of the present invention. The flyback power converter circuit 7000 of this embodiment is similar to the flyback power converter circuit 6000 of previous embodiment, but is different in that: in this embodiment, the light emitting diode 411 of the photocoupler 41 is driven by a current dropper 43. The current dropper 43 for example includes a transistor Q1. A first error amplifier 22' of the secondary side controller circuit 206' is configured to operably amplify a difference between the internal output voltage Voi and the first reference voltage Vf1, so as to generate a secondary side feedback signal Vds'. The internal output voltage Voi is determined according to the first reference voltage Vf1. In one embodiment, the internal output voltage Voi can be regulated to be, for example, equal to the first reference voltage Vf1. In this embodiment, the secondary side feedback signal Vds' can be coupled to, for example, a base of the transistor Q1, whereby a collector of the transistor Q1 supplies the bias current Id. In this embodiment, the light emitting diode 411 for example can be coupled between the internal output voltage Voi and the collector of the transistor Q1. In one embodiment, the primary side controller circuit 106 and the secondary side controller circuit 206' can form a conversion controller circuit 700.

The present invention has been described in considerable detail with reference to certain preferred embodiments thereof. It should be understood that the description is for illustrative purpose, not for limiting the broadest scope of the present invention. An embodiment or a claim of the present invention does not need to achieve all the objectives or advantages of the present invention. The title and abstract are provided for assisting searches but not for limiting the scope of the present invention. Those skilled in this art can readily conceive variations and modifications within the spirit of the present invention. For example, to perform an action "according to" a certain signal as described in the context of the present invention is not limited to performing an action strictly according to the signal itself, but can be performing an action according to a converted form or a scaled-up or down form of the signal, i.e., the signal can be processed by a voltage-to-current conversion, a current-to-voltage conversion, and/or a ratio conversion, etc. before an action is performed. It is not limited for each of the embodiments described hereinbefore to be used alone; under the spirit of the present invention, two or more of the embodiments described hereinbefore can be used in combination. For example, two or more of the embodiments can be used together, or, a part of one embodiment can be used to replace a corresponding part of another embodiment. In view of the foregoing, the spirit of the present invention should cover all such and other modifications and variations, which should be interpreted to fall within the scope of the following claims and their equivalents.

What is claimed is:

1. A flyback power converter circuit, comprising:
   a transformer, which is coupled between an input voltage and an internal output voltage;
   a blocking switch, which is configured to operably control an electric connection between the internal output voltage and an external output voltage;
   a primary side switch, which is configured to operably control a primary side winding of the transformer, so as to convert the input voltage to the internal output voltage at a secondary side of the transformer;
   a primary side controller circuit, which is configured to operably control the primary side switch; and
   a secondary side controller circuit, which is configured to operably control the blocking switch;
   wherein in a standby mode, the internal output voltage is regulated to a standby voltage and the blocking switch is controlled to be OFF; and wherein in an operation mode, the internal output voltage is regulated to an operating voltage and the blocking switch is controlled to be ON, such that the external output voltage has the operating voltage; wherein the standby voltage is smaller than the operating voltage to reduce the power consumption of the flyback power converter circuit in the standby mode;
   wherein the transformer includes an auxiliary winding, which is configured to operably generate an auxiliary voltage, wherein a proportional relationship exists between the auxiliary voltage and the internal output voltage;
   wherein the primary side controller circuit includes a second error amplifier, which is configured to operably amplify a difference between an adjustment voltage and a second reference voltage, so as to generate an error amplification signal; wherein the adjustment voltage is a divided voltage of the auxiliary voltage;
   wherein in the standby mode, the primary side controller circuit adjusts the second reference voltage, so as to set the standby voltage, and wherein in the operation mode, the primary side controller circuit adjusts the second reference voltage, so as to set the operating voltage.

2. The flyback power converter circuit of claim 1, wherein the secondary side controller circuit includes a detection controller circuit, which is configured to operably determine whether the flyback power converter circuit is coupled to a load and to operably control the blocking switch;
   wherein when it is determined that the flyback power converter circuit is coupled to the load, the blocking switch is controlled to be ON, and wherein when it is determined that the flyback power converter circuit is not coupled to the load, the blocking switch is controlled to be OFF.

3. A flyback power converter circuit, comprising:
   a transformer, which is coupled between an input voltage and an internal output voltage;
   a primary side switch, which is configured to operably control a primary side winding of the transformer, so as to convert the input voltage to the internal output voltage at a secondary side of the transformer;
   a primary side controller circuit, which is configured to operably control an adjustment resistor and the primary side switch;
   a secondary side controller circuit;
   a photocoupler, which is configured to operably couple a secondary side feedback signal generated from the secondary side controller circuit to generate a primary side feedback signal by means of photo coupling, and to input the primary side feedback signal to the primary side controller circuit, for regulating the internal output voltage; wherein the secondary side feedback signal is related to the internal output voltage; wherein the adjustment resistor is configured to operably provide a bias current to the photocoupler, so as to generate the primary side feedback signal;
   wherein in a standby mode, the adjustment resistor is controlled by the primary side controller circuit, so that the adjustment resistor has a standby resistance; and wherein in an operation mode, the adjustment resistor is controlled by the primary side controller circuit, so that the adjustment resistor has an operating resistance; wherein the standby resistance is greater than the operating resistance, so that the power consumption of the flyback power converter circuit is reduced in the standby mode.

4. The flyback power converter circuit of claim 3, further comprising:
   a blocking switch, which is configured to operably control an electric connection between the internal output voltage and an external output voltage;
   wherein in the standby mode, the blocking switch is controlled to be OFF; and wherein in the operation mode, the blocking switch is controlled to be ON.

5. The flyback power converter circuit of claim 4, wherein in the standby mode, when the blocking switch is controlled to be OFF, the internal output voltage is regulated to a standby voltage; and wherein in the operation mode, when the blocking switch is controlled to be ON, the internal output voltage is regulated to an operating voltage, such that the external output voltage has the operating voltage; wherein the standby voltage is smaller than the operating voltage.

6. The flyback power converter circuit of claim 4, wherein the secondary side controller circuit includes a detection controller circuit, which is configured to operably determine whether the flyback power converter circuit is coupled to a load and to operably control the blocking switch;
   wherein when it is determined that the flyback power converter circuit is coupled to the load, the blocking switch is controlled to be ON, and wherein when it is determined that the flyback power converter circuit is not coupled to the load, the blocking switch is controlled to be OFF.

7. A conversion controller circuit, which is configured to operably control a flyback power converter circuit, wherein the flyback power converter circuit includes: a transformer, which is coupled between an input voltage and an internal output voltage; and a primary side switch, which is configured to operably control a primary side winding of the transformer, so as to convert the input voltage to the internal output voltage at a secondary side of the transformer; the conversion controller circuit comprising:
   a primary side controller circuit, which is configured to operably control an adjustment resistor and the primary side switch;
   a secondary side controller circuit, which is configured to operably couple a secondary side feedback signal to generate a primary side feedback signal by means of photo coupling via a photocoupler, and to transmit the primary side feedback signal to the primary side controller circuit, for regulating the internal output voltage; wherein the secondary side feedback signal is related to the internal output voltage; wherein the adjustment resistor is configured to operably provide a bias current to the photocoupler, so as to generate the primary side feedback signal;

wherein in a standby mode, the adjustment resistor is controlled by the primary side controller circuit, so that the adjustment resistor has a standby resistance; and wherein in an operation mode, the adjustment resistor is controlled by the primary side controller circuit, so that the adjustment resistor has an operating resistance;

wherein the standby resistance is greater than the operating resistance, so that the power consumption of the flyback power converter circuit is reduced in the standby mode.

8. The conversion controller circuit of claim 7, wherein the flyback power converter circuit further comprises: a blocking switch, which is configured to operably control an electric connection between the internal output voltage and an external output voltage;

wherein in the standby mode, the blocking switch is controlled to be OFF; and wherein in the operation mode, the blocking switch is controlled to be ON.

9. The conversion controller circuit of claim 8, wherein in the standby mode, when the blocking switch is controlled to be OFF, the internal output voltage is regulated to a standby voltage; and wherein in the operation mode, when the blocking switch is controlled to be ON, the internal output voltage is regulated to an operating voltage, such that the external output voltage has the operating voltage; wherein the standby voltage is smaller than the operating voltage.

10. The conversion controller circuit of claim 8, wherein the secondary side controller circuit includes a detection controller circuit, which is configured to operably determine whether the flyback power converter circuit is coupled to a load and to operably control the blocking switch;

wherein when it is determined that the flyback power converter circuit is coupled to the load, the blocking switch is controlled to be ON, and wherein when it is determined that the flyback power converter circuit is not coupled to the load, the blocking switch is controlled to be OFF.

* * * * *